United States Patent
McCombs, Jr. et al.

(10) Patent No.: US 12,087,353 B2
(45) Date of Patent: Sep. 10, 2024

(54) BURST READ WITH FLEXIBLE BURST LENGTH FOR ON-CHIP MEMORY

(71) Applicant: Arm Limited, Cambridge (GB)

(72) Inventors: Edward Martin McCombs, Jr., Austin, TX (US); Andrew David Tune, Dronfield (GB); Sean James Salisbury, Dendron (GB); Rahul Mathur, Austin, TX (US); Hsin-Yu Chen, Austin, TX (US); Phani Raja Bhushan Chalasani, Austin, TX (US)

(73) Assignee: Arm Limited, Cambridge (GB)

( * ) Notice: Subject to any disclaimer, the term of this patent is extended or adjusted under 35 U.S.C. 154(b) by 139 days.

(21) Appl. No.: 17/885,709

(22) Filed: Aug. 11, 2022

(65) Prior Publication Data

US 2024/0055047 A1 Feb. 15, 2024

(51) Int. Cl.
| | |
|---|---|
| G11C 11/00 | (2006.01) |
| G11C 11/408 | (2006.01) |
| G11C 11/4091 | (2006.01) |
| G11C 11/4094 | (2006.01) |
| G11C 11/4096 | (2006.01) |

(52) U.S. Cl.
CPC ........ *G11C 11/4096* (2013.01); *G11C 11/408* (2013.01); *G11C 11/4091* (2013.01); *G11C 11/4094* (2013.01)

(58) Field of Classification Search
CPC .............. G11C 11/4096; G11C 11/408; G11C 11/4091; G11C 11/4094
See application file for complete search history.

(56) References Cited

U.S. PATENT DOCUMENTS

| 5,652,724 A * | 7/1997 | Manning ................. G11C 7/109 |
| | | 711/E12.083 |
| 6,628,566 B2 * | 9/2003 | Jeong ....................... G11C 8/08 |
| | | 365/233.13 |
| 7,234,034 B2 * | 6/2007 | Spriggs ................ G11C 7/1063 |
| | | 713/400 |
| 2007/0153584 A1 | 7/2007 | Mohammad et al. |
| 2009/0059700 A1* | 3/2009 | Yoo .......................... G11C 7/12 |
| | | 365/233.1 |
| 2010/0128550 A1 | 5/2010 | Lovett |
| 2017/0357597 A1 | 12/2017 | Tune |
| 2024/0054073 A1 | 2/2024 | Tune et al. |
| 2024/0055034 A1 | 2/2024 | Mccombs, Jr. |
| 2024/0055035 A1 | 2/2024 | Mccombs, Jr. |

OTHER PUBLICATIONS

Nakamura et al., "A 500-MHz 4-Mb CMOS pipeline-burst cache SRAM with point-to-point noise reduction coding I/O," IEEE Journal of Solid-State Circuits, vol. 32, No. 11, pp. 1758-1765, Nov. 1997 (DOI: 10.1109/4.641698).

(Continued)

*Primary Examiner* — Pho M Luu
(74) *Attorney, Agent, or Firm* — Leveque Intellectual Property Law, P.C.

(57) ABSTRACT

A burst read with flexible burst length for on-chip memory, such as, for example, system cache memory, hierarchical cache memory, system memory, etc. is provided. Advantageously, successive burst reads are performed with less signal toggling and fewer bitline swings.

18 Claims, 7 Drawing Sheets

(56) References Cited

OTHER PUBLICATIONS

Sato et al., "A 500-MHz pipelined burst SRAM with improved SER immunity," IEEE Journal of Solid-State Circuits, vol. 34, No. 11, pp. 1571-1579, Nov. 1999 (DOI: 10.1109/4.799865).
Augustine et al., "2X-Bandwidth Burst 6T-SRAM for Memory Bandwidth Limited Workloads", 20 IEEE Symposium on VLSI Circuits, Jun. 16-19, 2020 (DOI: 10.1109/VLSICircuits18222. 2020).
Salvador Petit, Julio Sahuquillo, Jose M. Such, and David Kaeli. May 4-6, 2005. Exploiting temporal locality in drowsy cache policies. In Proceedings of the 2nd conference on Computing frontiers (CF '05). Association for Computing Machinery, New York, NY, USA, 371-377. https://doi.org/10.1145/1062261. 1062321.
The Hell of Caches; Rodgers et al.: Oct. 13-16, 2010; retrieved from https://web.archive.org/web/20101013063833/http://www.cs.umd. edu/~meesh/cmsc411/website/projects/out/hoc/cache.htm on Sep. 29, 2023 (Year: 2010).

\* cited by examiner

BURST READ WITH FLEXIBLE BURST LENGTH FOR ON-CHIP MEMORY

BACKGROUND

The present disclosure relates to computer systems. More particularly, the present disclosure relates to memory.

Previous memory burst read schemes have typically been used for achieving higher bandwidth, and may enable I/O to operate at a higher frequency than static random access memory (SRAM) to increase data transfer. However, these schemes are inflexible with respect to burst length and generate undesirable signal toggling and bitline swings.

DETAILED DESCRIPTION

Figure 1:
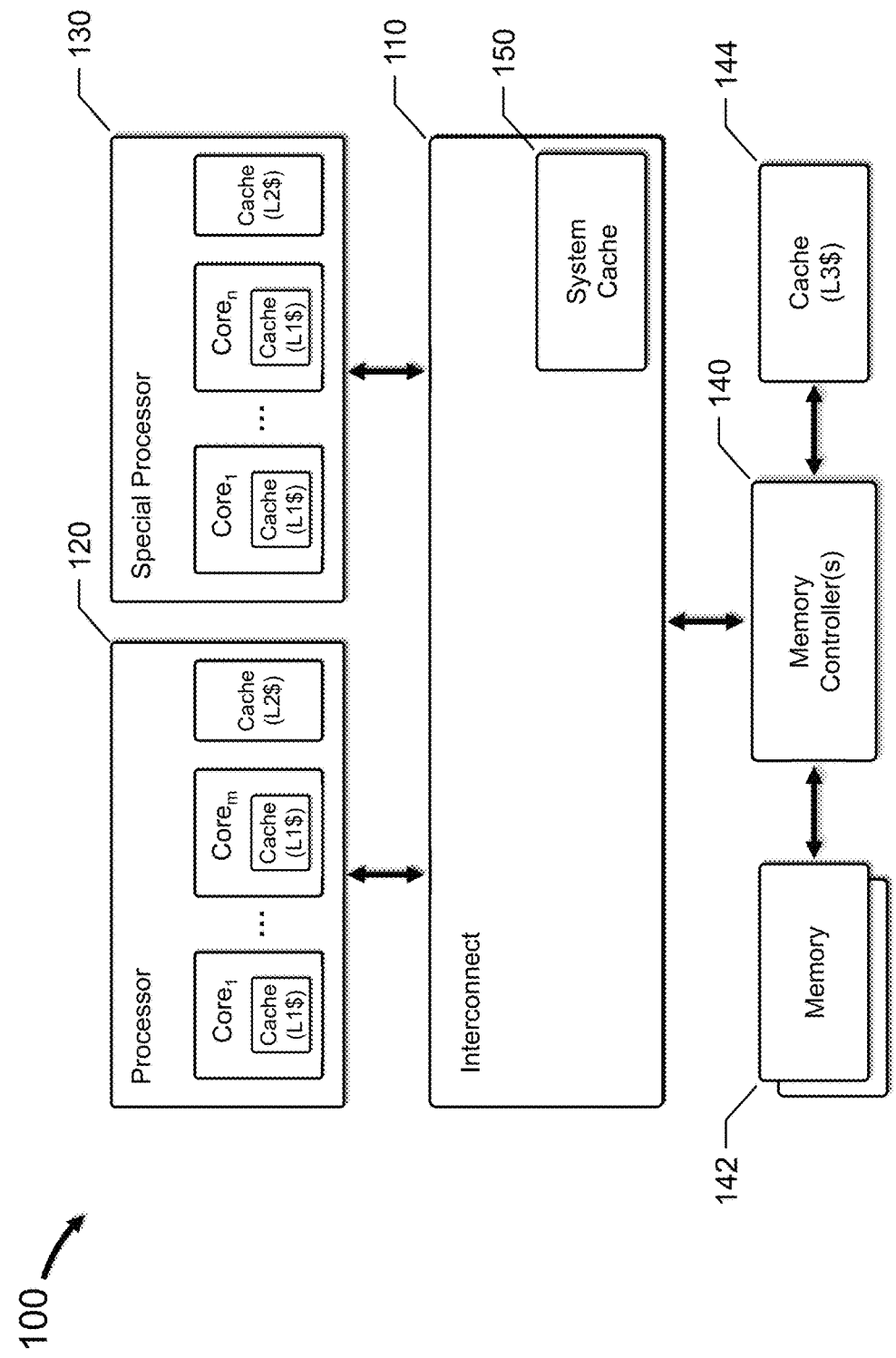
FIG. 1 depicts a block diagram of a system, in accordance with an embodiment of the present disclosure.

Embodiments of the present disclosure will now be described with reference to the drawing figures, in which like reference numerals refer to like parts throughout.

One burst memory read scheme enables the cycle time for an internal memory core (e.g., I-cycle) to be extended to 4 times that of an external bus cycle (e.g., E-cycle). A 128-bit I/O SRAM core may be operated in an I-cycle of 8 ns, while a 32-bit I/O may be operated in an E-cycle of 2 ns. In a memory read operation, a read address may be immediately applied to the SRAM core to prefetch 128-bit data for a single burst read operation. A parallel-in serial-out (PISO) buffer may convert the 128-bit I-cycle readout data to a four 32-bit E-cycle data stream.

In another burst memory scheme, a pipelined burst RAM translates a four-cycle burst operation into one memory core transaction by using a 144-bit read register, 144-bit write register, and 4:1 multiplexor (MUX) circuits. The translation reduces the SRAM core frequency down to one-fourth (i.e., 25%) of the I/O frequency.

In another burst memory scheme, memory cells in consecutive columns of the SRAM may be sequentially accessed with one wordline (WL) activation and one bitline (BL) precharge (BLPCH). In this scheme, a 4-way column multiplexing arrangement shares a single sense amplifier, and, after the WL generates the signal differential on the BL pair in each column, 4 bits are read out in consecutive phases from the sense amplifier, i.e., one bit per column per phase.

Embodiments of the present disclosure provide a burst read with flexible burst length for on-chip memory, such as, for example, system cache memory, hierarchical cache memory, system memory, etc. Advantageously, embodiments of the present disclosure perform successive burst reads with less signal toggling and fewer bitline swings.

In one embodiment, a memory includes an array of random access memory storage elements, including selectable rows and groups of selectable columns, configured to output a selected number of words in response to a row select signal and a sequence of column select signals; and circuitry configured to receive a burst read request including a memory address and a burst address indicating the selected number of words, generate the row select signal based on the memory address, generate the sequence of column select signals based on the burst address, and provide the row select signal and the sequence of column select signals to the array.

FIG. 1 depicts a block diagram for SoC 100, in accordance with an embodiment of the present disclosure.

In this embodiment, SoC 100 includes interconnect 110 coupled to, inter alia, processor(s) 120, accelerator(s) or special processor(s) 130, and memory controller(s) 140 coupled to system memory 142 and last-level (or system level) cache 144. Other components may also be coupled to interconnect 110, such as, for example, network controllers and I/O interfaces, etc. In other embodiments, SoC 100 is a general purpose computer system, and interconnect 110 is a bus that transfers data between processor 120, special processor 130, memory controller 140, memory 142 and last-level cache 144, as well as other components.

Interconnect 110 is a communication system that transfers data between processor 120, special processor 130, memory controller 140, memory 142 and last-level cache 144, as well as other components. Interconnect 110 may also include system cache 150. Certain components of SoC 100 may be classified as a particular type of interconnect protocol node.

Generally, interconnect 110 may include, inter alia, a shared or hierarchical bus, a crossbar switch, a packet-based network-on-chip (NoC), etc. In one embodiment, interconnect 110 has a crossbar topology that provides an ordered network with low latency, and may be particularly suitable for a small-sized interconnect with a small number of protocol nodes, switches and wire counts. In another embodiment, interconnect 110 has a ring topology that balances wiring efficiency with latency, which increases linearly with the number of protocol nodes, and may be particularly suitable for a medium-sized interconnect. In a further embodiment, interconnect 110 has a mesh topology that has more wires to provide greater bandwidth, is modular and easily scalable by adding more rows and columns of switches or routers, and may be particularly suitable for a large-sized interconnect.

Generally, interconnect 110 may be a coherent or incoherent interconnect. In many embodiments, interconnect 110 is a coherent mesh network that includes multiple switches or router logic modules (routers) arranged in a two-dimensional rectangular mesh topology, such as, for example, the Arm CoreLink Coherent Mesh Network. In this example, the switches or routers are crosspoints (i.e., XPs). Each XP may connect up to four neighboring XPs using mesh ports, and may connect to one or two components (devices) using device ports. Additionally, each XP may support four coherent hub interface (CHI) channels to transport data from a source device to a destination or target device, as described, for example, in the Arm Advanced Microcontroller Bus Architecture (AMBA) CHI specification.

In these embodiments, interconnect 110 may have an architecture that includes three layers, i.e., an upper protocol layer, a middle network layer, and a lower link layer. The protocol layer generates and processes requests and responses at the protocol nodes, defines the permitted cache state transitions at the protocol nodes that include caches, defines the transaction flows for each request type, and manages the protocol level flow control. The network layer packetizes the protocol message, determines, and adds to the packet, the source and target node IDs required to route the packet over interconnect 110 to the required destination. The link layer provides flow control between components, and manages link channels to provide deadlock free switching across interconnect 110.

Processor 120 is a general-purpose, central processing unit (CPU) that executes instructions to perform various functions for SoC 100, such as, for example, control, computation, input/output, etc. More particularly, processor 120 may include a single processor core or multiple processor cores (or processing circuitries), which may be arranged in a processor cluster, such as, for example the Arm Cortex A, R and M families of processors. Each processor core may include a level 1 or L1 cache (L1$), and each processor 120 may include a level 2 or L2 cache (L2$) coupled to each processor core. Generally, processor 120 may execute computer programs or modules, such as an operating system, application software, other software modules, etc., stored within a memory, such as, for example, memory 142, etc.

Accelerator or special processor 130 is a specialized processor that is optimized to perform a specific function, such as process graphics, images and/or multimedia data, process digital signal data, process artificial neural network data, etc. For example, accelerator or special processor 130 may be a graphics processing unit (GPU), a digital signal processor (DSP), an image signal processor (ISP), a neural processing unit (NPU), etc. More particularly, accelerator or special processor 130 may include a single processor core or multiple processor cores (or processing circuitries), such as, for example the Arm Mali family of GPUs, display processors and video processors, the Arm Machine Learning processor, etc. Each processor core may include a level 1 or L1 cache (L1$), and each accelerator or special processor 130 may include a level 2 or L2 cache (L2$) coupled to each processor core.

Memory controller 140 may include a microprocessor, microcontroller, application specific integrated circuit (ASIC), field programmable gate array (FPGA), custom circuitry, programmable registers, etc., and are configured to provide access to memory 142 through interconnect 110. Memory 142 may include a variety of non-transitory computer-readable medium that may be accessed by the other components of SoC 100, such as processor 120, accelerator or special processor 130, etc., and may be located on-chip or off-chip. For example, memory 142 may store data and instructions for execution by processor 120, accelerator or special processor 130, etc.

Generally, memory controller 140 and memory 142 provide storage for retrieving, presenting, modifying, and storing data. For example, memory 142 stores software modules that provide functionality when executed by processor 120, accelerator or special processor 130, etc. The software modules include an operating system that provides operating system functionality for SoC 100. Software modules provide various functionality, such as image classification, etc. Data may include data associated with the operating system, the software modules, etc.

In various embodiments, memory 142 may include volatile and nonvolatile medium, non-removable medium and/or removable medium. For example, memory may include any combination of random access memory (RAM), dynamic RAM (DRAM), double data rate (DDR) DRAM or synchronous DRAM (SDRAM), static RAM (SRAM), read only memory (ROM), HMC (Hybrid Memory Cube), HBM (High Bandwidth Memory), flash memory, cache memory, and/or any other type of non-transitory computer-readable medium. In certain embodiments, memory controller 140 is a dynamic memory controller that provides data transfers to and from high-density DDR3, DDR4 or DDR5 DRAM memory, such as, for example, the Arm CoreLink Dynamic Memory Controller (DMC) family, each of which includes a fast, single-port CHI channel interface for connecting to interconnect 110.

Last-level cache 144 includes high-speed SRAM, etc., and is typically known as a last-level, level 3 or L3 cache (L3$) that is provided between processor 120, special processor 130, etc., and memory 142.

System cache 150 also includes high-speed SRAM, etc., and acts as a shared memory between processors 120, special processors 130 and peripherals to lessen memory bottleneck issues between data sources and processors.

As suggested above, the caches form a hierarchy, so when a processor core requires access to a data item, such as a processing instruction and/or data to be handled by the processing instruction, the processor core will first attempt to obtain or access that data item in the respective L1 cache. In the case of a cache miss, a search will be performed through the next closest cache levels, with an access to memory 142 performed only if the attempted cache accesses all miss. When the required data item is obtained from memory 142, a copy may be saved in one or more caches.

In general terms, the L1 cache is normally implemented proximate to the respective processor core to provide rapid, low latency and potentially energy efficient access to data stored by that L1 cache. The L2 cache is implemented to be further away from the respective processor core, and may be larger than the L1 cache. The L3 cache is implemented to be further still from the respective processor core, but is closest, in the hierarchy, to memory 142 and is much larger than the L2 cache. In the embodiment depicted in FIG. 1, processor 120 and special processor 130 have multiple processor cores, and each processor core has a respective L1 cache. In other embodiments, one or more L1 caches (L1$s) may be shared between processing cores. Processor 120 and special processor 130 also have an L2 cache (L2$) that is shared between the processor cores.

Last-level cache 144 provides the last level of cache (L3$) between processor 120 and special processor 130 and memory 142. Generally, accessing data from a cache not only reduces latency but also reduces access power consumption when compared to accessing the same data from memory 142.

Rather than a last level cache, system cache 150 provides a scratch pad memory for any processor or peripheral that connects to SoC 100. The address space for system cache 150 lies is a region of the address space of SoC 100 that is separate from the address space of memory 142 and memory-mapped I/O, such as peripherals.

Generally, accessing data from a cache not only reduces latency but also reduces access power consumption when compared to accessing the same data from memory 142.

Additionally, the caches may operate under an inclusive or exclusive cache policy. An inclusive cache policy ensures that data stored in a particular cache is also stored in any lower level caches. For example, a value in an L1 cache would also be present in the respective L2 cache and final L3 cache. On the other hand, an exclusive cache policy ensures that data are only stored in one level of the cache. For example, a value in an L1 cache would not be present in the respective L2 cache and final L3 cache.

SoC 100 may also include I/O interface(s) (not depicted), coupled to interconnect 110, that are configured to transmit and/or receive data from I/O devices. The I/O interfaces enable connectivity between processor 120, special processor 130, etc. and the I/O devices by encoding data to be sent to the I/O devices, and decoding data received from the I/O devices. Generally, data may be sent over wired and/or wireless connections. For example, the I/O interfaces may include one or more wired communications interfaces, such as PCIe, USB, etc., and/or one or more wireless communications interfaces, coupled to one or more antennas, such as WiFi, Bluetooth, cellular, etc.

Generally, the I/O devices provide input to SoC 100 and/or output from SoC 100. As discussed above, the I/O devices are operably connected to the I/O controller using a wired and/or wireless connection. The I/O devices may include a local processor coupled to a communication interface that is configured to communicate with SoC 100 using the wired and/or wireless connection. For example, the I/O devices may include a keyboard, mouse, touch pad, joystick, etc.

SoC 100 may also include network interface(s) configured to transmit data to and from one or more networks using one or more wired and/or wireless connections. The networks may include one or more local area networks, wide area networks, the Internet, etc., which may execute various network protocols, such as, for example, wired and/or wireless Ethernet, Bluetooth, etc. The networks may also include various combinations of wired and/or wireless physical layers, such as, for example, copper wire or coaxial cable networks, fiber optic networks, Bluetooth wireless networks, WiFi wireless networks, CDMA, FDMA and TDMA cellular wireless networks, etc.

Figure 2:
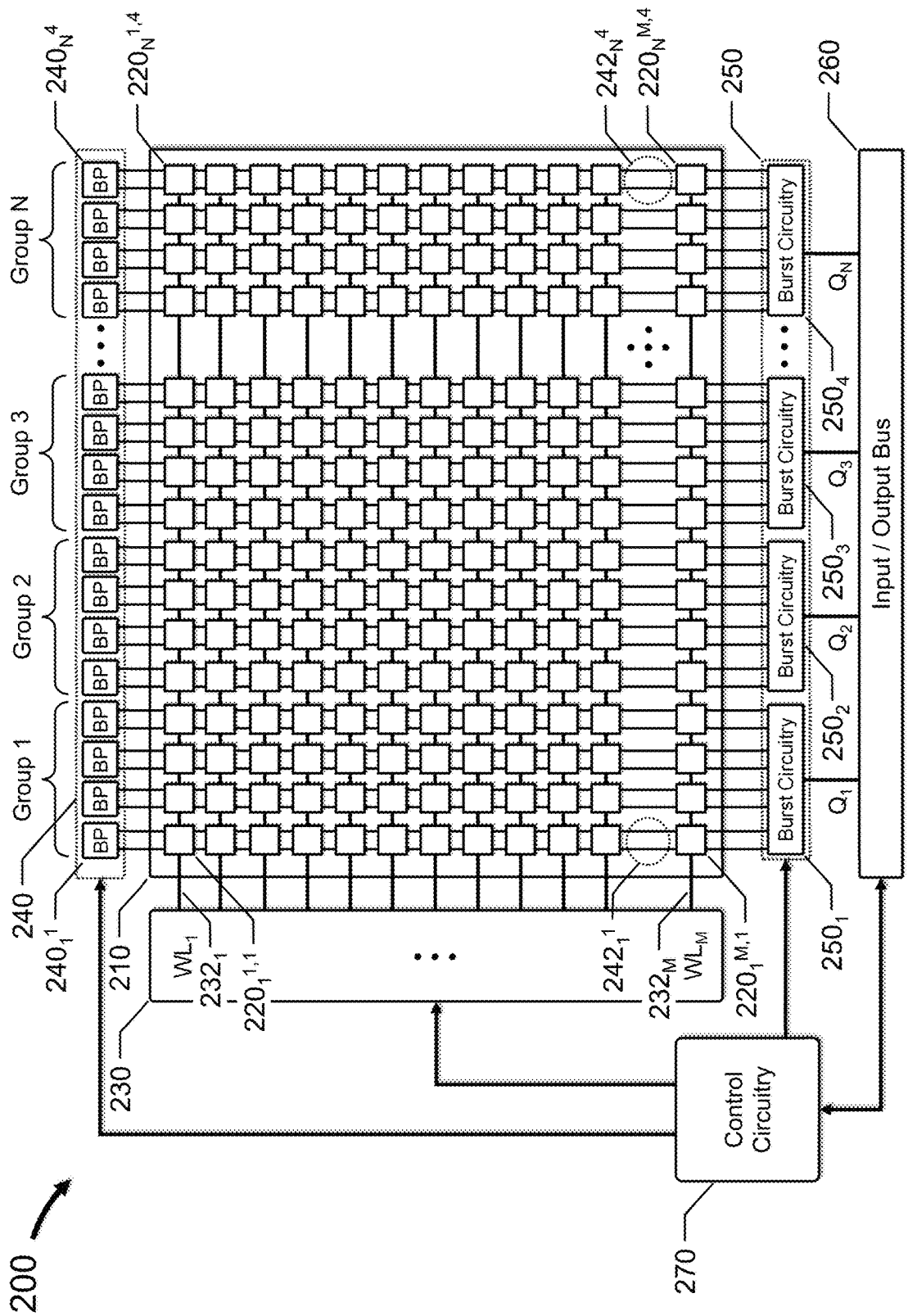
FIG. 2 depicts a block diagram of a memory, in accordance with an embodiment of the present disclosure.

FIG. 2 depicts a block diagram of on-chip memory 200, in accordance with an embodiment of the present disclosure. Memory 200 will be described with respect to system cache memory embodiments; other embodiments are also supported, such as, hierarchical cache memory embodiments, system memory embodiments, etc.

Memory 200 includes, inter alia, an array 210 including memory cells 220, wordlines 232 and bitlines pairs 242, address decoder 230, bitline precharge circuitry 240, burst read circuitry 250, input/output (I/O) bus 260 and control circuitry 270. Conventional write circuitry has been omitted for clarity, and, in many embodiments, conventional read circuitry may be easily integrated.

Generally, memory cells 220 are coupled to wordlines 232 to form rows, and to bitlines pairs 242 to form columns. More particularly, each memory cell 220 is coupled to one wordline 232 and one bitline pair 242, and stores a single bit having a value of 0 or 1. In a simple memory architecture, the number of columns is equal to the word length of the memory, and each row of memory cells 220 stores one word by storing one bit of the word in each memory cell 220 of the row. For example, a memory having a word length of 32 bits (i.e., 4 bytes) has 32 columns of memory cells 220.

For both reading and writing data, each word is identified by an address, which is an m-bit number that is decoded to provide the row number (i.e., wordline) along which the word is stored. For example, an 8-bit address encodes 256 rows, i.e., $M=2^8=256$, a 10-bit address encodes 1,024 rows, i.e., $M=2^{10}=1024$, etc. The address may be input to address decoder 230 via m individual bit or signal lines, as a m-bit unsigned integer value, etc. The memory size is simply the number of addresses multiplied by the word length, such as, for example, 1024 addresses 4 bytes/address=4096 bytes.

Embodiments of the present disclosure provide a more sophisticated memory architecture in which the columns are arranged into a number of groups in order to store multiple words along each row of the memory.

In many embodiments, the width of I/O bus 260 is one word (e.g., 32 bits). Generally, cache memory may be divided into a number of ways, and the number of groups, N, is equal to the number of ways multiplied by the word size. For example, N is equal to 32 for a 1-way cache with 32-bit words (N=1·32=32), N is equal to 256 for an 8-way cache with 32-bit words (N=8·32=256), etc. In many embodiments, the way number is determined by the lower w-bits of the address, while the remaining bits are decoded to determine the wordline. For example, the lower 3 bits of the address determine the way number for an 8-way cache, (i.e., $2^3=8$). The number of columns in each group, C, is the same (e.g., 4), and each row stores N C words.

In order to access the words stored in a row, embodiments of the present disclosure provide a burst address that identifies which word or words are to be accessed by a burst read request for a particular address (i.e., row). As described herein, embodiments of the present invention provide significant advantages over other burst read schemes including lower dynamic power consumption, lower latency, etc.

For ease of description, a memory with a single way is described.

Generally, each group includes at least two columns. In the embodiment depicted in FIG. 2, each group includes four columns, i.e., C equals 4. The memory cells of group 1 store the value of the bit at the $1^{st}$ bit position of every word, the memory cells of group 2 store the value of the bit at the 2nd bit position of every word, the memory cells of group 3 store the value of the bit at the $3^{rd}$ bit position of every word, and so on. The memory cells of group N store the value of the bit at the $N^{th}$ bit position of every word.

For clarity, only certain elements have been labeled with reference numbers.

Group 1 includes four columns of memory cells 220, indexed by group number, row number and column number within the group. The first column includes memory cells $220_1^{1,1}$ (labeled), ..., $220_1^{M,1}$ (labeled), the second column includes memory cells $220_1^{1,2}$, ..., $220_1^{M,2}$, the third column includes memory cells $220_1^{1,3}$, ..., $220_1^{M,3}$, and the fourth column includes memory cells $220_1^{1,4}$, ..., $220_1^{M,4}$. For group 2, the first column includes memory cells $220_2^{1,1}$, ..., $220_2^{M,1}$, the second column includes memory cells $220_2^{1,2}$, ..., $220_2^{M,2}$, the third column includes memory cells $220_2^{1,3}$, ..., $220_2^{M,3}$ and the fourth column includes memory cells $220_2^{1,4}$, ..., $220_2^{M,4}$. For group 3, the first column includes memory cells $220_3^{1,1}$, ..., $220_3^{M,1}$, the second column includes memory cells $220_3^{1,2}$, ..., $220_3^{M,2}$, the third column includes memory cells $220_3^{1,3}$, ..., $220_3^{M,3}$, and the fourth column includes memory cells $220_3^{1,4}$, ..., $220_3^{M,4}$. And so on for each group. For group N, the first column includes memory cells $220_N^{1,1}$, ..., $220_N^{M,1}$, the second column includes memory cells $220_N^{1,2}$, ..., $220_N^{M,2}$, the third column includes memory cells $220_N^{1,3}$, ..., $220_N^{M,3}$, and the fourth column includes memory cells $220_N^{1,4}$ (labeled), ..., $220_N^{M,4}$ (labeled).

Group 1 includes bitline pairs $242_1^{1}$ (labeled), $242_1^{2}$, $242_1^{3}$, $242_1^{4}$, group 2 includes bitline pairs $242_1^{1}$, $242_2^{2}$, $242_2^{3}$, $242_2^{4}$, group 3 includes bitline pairs $242_3^{1}$, $242_3^{2}$, $242_3^{3}$, $242_3^{4}$, and so on for each group. Group N includes bitline pairs $242_N^{1}$, $242_N^{2}$, $242_N^{3}$, $242_N^{4}$ (labeled). Each bitline pair includes two bitlines, a bitline (i.e., $BL_i$) and a "not" bitline (i.e., $NBL_i$ or bitline bar $\overline{BL_i}$).

Bitline precharge circuitry 240 includes a bitline precharge circuit $240_i^j$ coupled to each bitline pair 242. Group 1 includes bitline precharge circuitry $240_1^1$ (labeled) coupled to bitline pairs $242_1^1$ (labeled), bitline precharge circuitry $240_1^2$ coupled to bitline pairs $242_1^2$, bitline precharge circuitry $240_1^3$ coupled to bitline pairs $242_1^3$, bitline precharge circuitry $240_1^4$ coupled to bitline pairs $242_1^4$, and so on for each group. Group N includes bitline precharge circuitry $240_N^1$ coupled to bitline pairs $242_N^1$, bitline precharge circuitry $240_N^2$ coupled to bitline pairs $242_N^2$, bitline precharge circuitry $240_N^3$ coupled to bitline pairs $242_N^3$, bitline precharge circuitry $240_N^4$ (labeled) coupled to bitline pairs $242_N^4$ (labeled). Generally, bitline precharge circuitry 240 may be coupled to the bitline pairs of each column prior to the first row of memory cells 220, i.e., memory cells $220_1^{1,1}, \ldots, 220_N^{1,4}$, or after the last row of memory cells 220, i.e., memory cells $220_1^{M,1}, \ldots, 2200_N^{M,4}$.

Burst read circuitry 250 includes burst read circuitry $250_i$ coupled to the bitline pairs $242_i^j$ of each group, I/O bus 260 and control circuitry 270. For group 1, burst read circuitry $250_1$ (labeled) is coupled to bitline pairs $242_1^1$ (labeled), bitline pairs $242_1^2$, bitline pairs $242_1^3$ and bitline pairs $242_1^4$, and outputs the value of the 1st bit position (i.e., $Q_1$) of the selected word to I/O bus 260. For group 2, burst read circuitry 2502 (labeled) is coupled to bitline pairs $242_2^1$, bitline pairs $242_2^2$, bitline pairs $242_2^3$ and bitline pairs $242_2^4$, and outputs the value of the 2 nd bit position (i.e., $Q_2$) of the selected word to I/O bus 260. For group 3, burst read circuitry $250_3$ (labeled) is coupled to bitline pairs $242_3^1$, bitline pairs $242_3^2$, bitline pairs $242_3^3$ and bitline pairs $242_3^4$, and outputs the value of the 3rd bit position (i.e., $Q_3$) of the selected word to I/O bus 260. And so on for each group. For group N, burst read circuitry 250N (labeled) is coupled to bitline pairs $242_N^1$, bitline pairs $242_N^2$, bitline pairs $242_N^3$ and bitline pairs $242_N^4$ (labeled), and outputs the value of the $N^{th}$ bit position (i.e., $Q_N$) of the selected word to I/O bus 260. I/O bus 260 may include a shared input and output bus, or separate input and output busses. Certain information described below may be provided to memory 200 as electrical signals via hardware pins, as digital data conveyed by I/O bus 260, or as a combination of electrical signals and digital data conveyed by I/O bus 260.

Control circuitry 270 may include one or more microprocessors, microcontrollers, ASICs, FPGAs, finite state machines (FSMs), etc., that are configured to control the operation of the memory 200, including processing signals and data, generating the appropriate control signals, etc. In many embodiments, control circuitry 270 includes FSM 400, discussed below.

In certain embodiments, burst circuitry 250, I/O bus 260, bitline precharge circuitry 240, etc. may be arranged in an I/O block extending laterally across the middle of array 210, so that half of the wordlines 232 are disposed on one side of the I/O block (e.g., $WL_1$ to $WL_{512}$), and half of the wordlines 232 are disposed on the other side of the I/O block (e.g., $WL_{513}$ to $WL_{1024}$).

Figure 3:
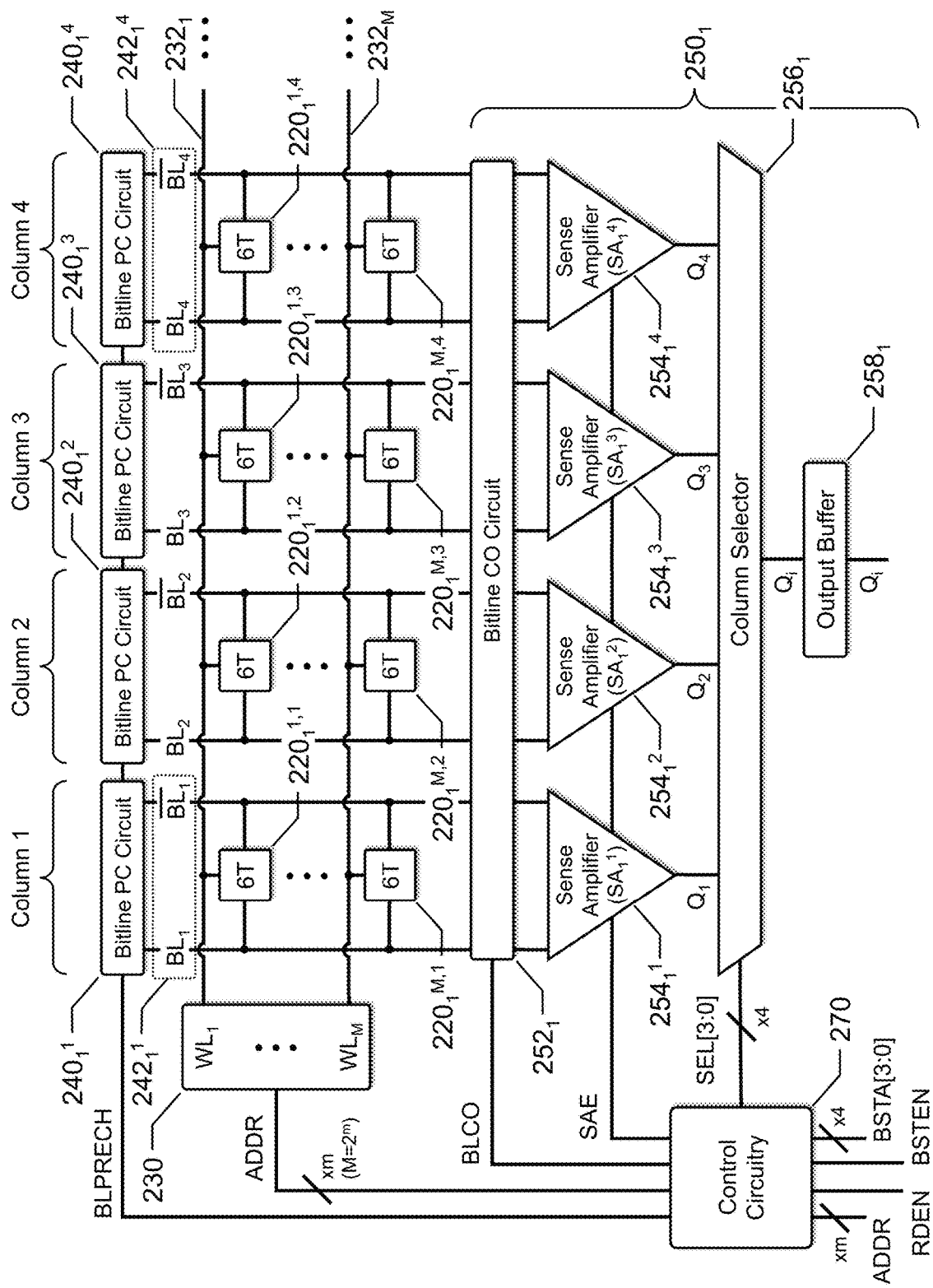
FIG. 3 depicts a block diagram of a portion of a memory, in accordance with an embodiment of the present disclosure.

FIG. 3 depicts a block diagram of a portion of memory 200, in accordance with an embodiment of the present disclosure.

More particularly, FIG. 3 depicts a more detailed view of group 1 and burst read circuitry $250_1$. As discussed above, group 1 includes four columns of memory cells 220 coupled to wordlines $232_1, \ldots, 232_M$, i.e., column 1, column 2, column 3 and column 4. Each column includes a bitline pair $242_1^1$ and M memory cells $220_1^{1,j}, \ldots, 220_1^{M,j}$. Column 1 includes bitline pair $242_1^1$ and memory cells $220_1^{M,1}, \ldots, 220_1^{M,1}$, column 2 includes bitline pair $242_1^2$ (not labeled for clarity) and memory cells $220_1^{1,2}, \ldots, 220_1^{M,2}$, column 3 includes bitline pair $242_1^3$ (not labeled for clarity) and memory cells $220_1^{M,3}, \ldots, 220_1^{M,3}$, and column 4 includes bitline pair $242_1^4$ and memory cells $220_1^{1,4}, \ldots, 220_1^{M,4}$.

In many embodiments, memory cells 220 are 6 transistor (6T) SRAM memory cells. Other memory cell types, e.g., 4 transistor (4T) memory cells, 8 transistor (8T) memory cells, 10 transistor (10T) memory cells, etc., are also supported, as are other memory technologies, including DRAM, etc. Generally, bitline pairs 242 are complementary bitlines, such as, for example, flying bitlines, twisted bitlines, etc.

Bitline precharge circuitry $240_1^1$ is coupled to bitline pair $242_1^1$ based on the control signal BLPRECH. Bitline precharge circuitry $240_1^2$ is coupled to bitline pair $242_1^2$ based on the control signal BLPRECH. Bitline precharge circuitry $240_1^3$ is coupled to bitline pair $242_1^3$ based on the control signal BLPRECH. Bitline precharge circuitry $240_1^4$ is coupled to bitline pair $242_1^4$ based on the control signal BLPRECH. Bitline precharge circuitry $240_1^1, 240_1^2, 240_1^3, 240_1^4$ precharges the respective bitline pair, i.e., bitline pairs $242_1^1, 242_1^2, 242_1^3, 242_1^4$, at the same time based on the control signal BLPRECH, in order to bring each bitline in the bitline pair to the same voltage before the read cycle.

Bitline cut-off circuitry $252_1$ is coupled to each bitline pair $242_1^1, 242_1^2, 242_1^3, 242_1^4$ after the last memory cell, i.e., memory cell $220_1^{M,1}, 220_1^{M,2}, 220_1^{M,3}, 220_1^{M,4}$. Bitline cut-off circuitry $252_1^{j,k}$ couples and decouples all of the bitline pairs, i.e., bitline pairs $242_1^1, 242_1^2, 242_1^3, 242_1^4$, to and from the inputs of sense amplifiers $254_1^1$ ($SA_1^1$), $254_1^2$ ($SA_1^2$), $254_1^3$ ($SA_1^3$), $254_1^4$ ($SA_1^5$), respectively, at the same time based on the control signal BLCO.

Sense amplifiers $254_1^1, 254_1^2, 254_1^3, 254_1^4$ sense the values stored within memory cells $220_i^{j,k}$ coupled to the selected wordline $232_i$ based on the control signal SAE, and output the sensed bit values $Q_1, Q_2, Q_3, Q_4$, respectively, to column selector $256_1$.

Column selector $256_1$ selects and provides the output of a selected sense amplifier $254_1^i$, i.e., $Q_i$, to output buffer $258_1$ based on four individual control signals SEL[3:0].

Output buffer $258_1$ provides the selected bit value $Q_i$ to I/O bus 260.

Control circuitry 270 is coupled to, inter alia, address decoder 230, bitline precharge circuitry $240_1^1, 240_1^2, 240_1^3, 240_1^4$, bitline cut-off circuitry $252_1$, sense amplifiers $254_1^1, 254_1^2, 254_1^3, 254_1^4$, and column selector $256_1$. In many embodiments, a burst read request includes a read enable signal (i.e., RDEN), a burst enable signal (i.e., BSTEN), a memory address signal (i.e., ADDR) and a burst address signal (i.e., BSTA). In response to receiving a burst read request, control circuitry 270 provides memory address ADDR to address decoder 230 and generates control signals BLPRECH, BLCO, SAE, and SEL.

Figure 4:
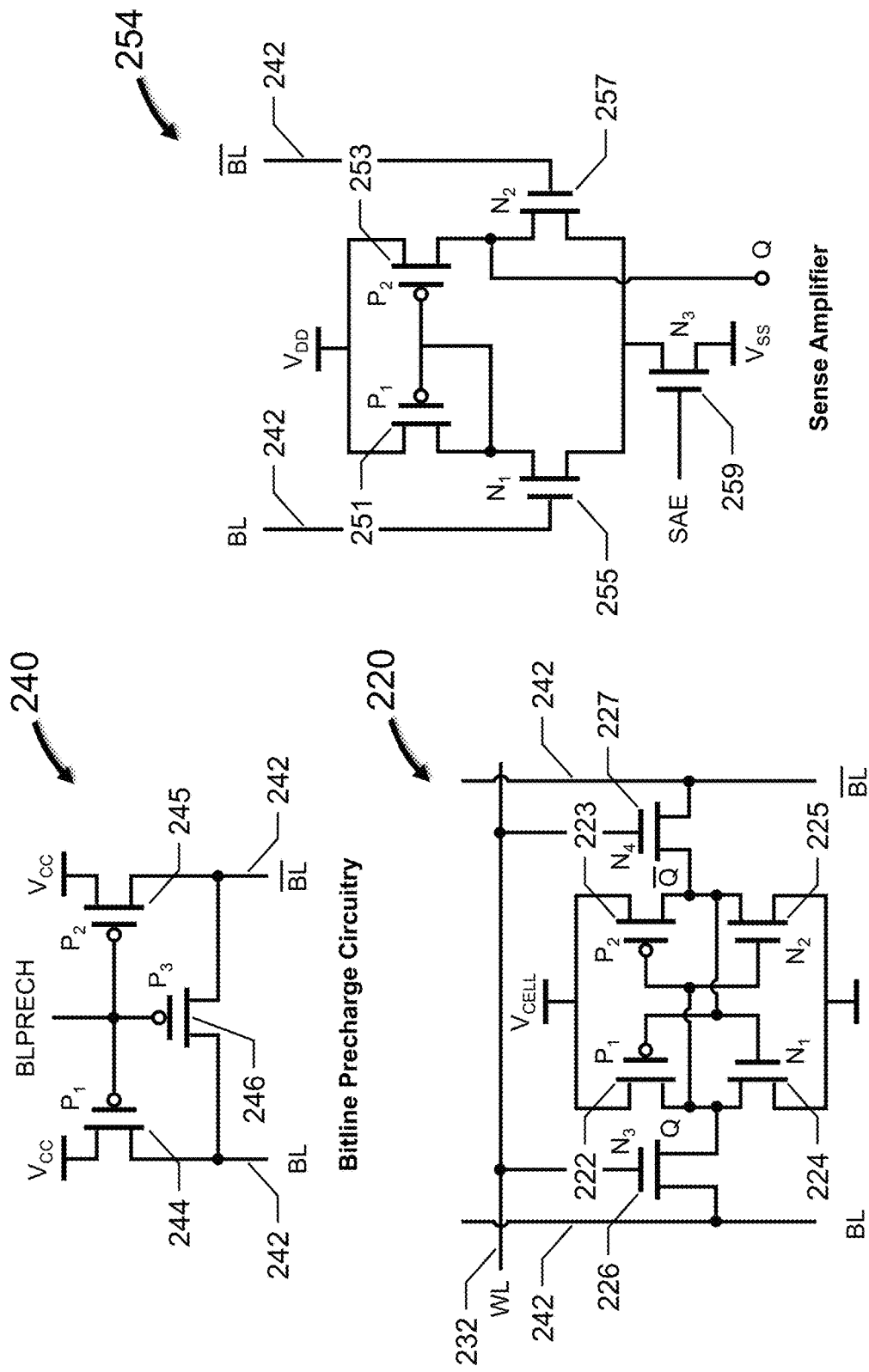
FIG. 4 depicts circuit diagrams of certain components of a memory, in accordance with an embodiment of the present disclosure.

FIG. 4 depicts circuit diagrams of certain components of memory 200, in accordance with an embodiment of the present disclosure.

Bitline precharge circuitry 240 includes transistors 244, 245, 246, which may be PMOS transistors ($P_1$, $P_2$ and $P_3$ depicted), NMOS transistors, etc.; other bitline precharge circuits are also supported. Each transistor includes source, gate and drain terminals.

More particularly, the source terminal of transistor 244 is coupled to a $V_{CC}$ voltage line, the drain terminal is coupled to BL and the gate terminal is coupled to the BLPRECH control signal line. The source terminal of transistor 245 is coupled to the $V_{CC}$ voltage line, the drain terminal is coupled to $\overline{BL}$ and the gate terminal is coupled to the BLPRECH control signal line. The source (or drain) terminal of transistor 246 coupled to BL, the drain (or source) terminal is coupled to BL and the gate terminal coupled to the BLPRECH control signal line. Transistor 246 ensures that BL and $\overline{BL}$ are brought to the same voltage before a burst read cycle. To precharge bitline pair 242, the BLPRECH control signal is set to a logic low signal, which turns on transistors 244, 245, 246 to charge and equalize BL and $\overline{BL}$ to $V_{CC}$.

Memory cell 220 include 2 PMOS transistors, i.e., transistors 222 ($P_1$), 223 ($P_1$), and 4 NMOS transistors, i.e., transistors 224 ($N_1$), 225 ($N_2$), 226 ($N_3$), 227 ($N_4$).

More particularly, a first inverter includes PMOS load transistor 222 and NMOS drive transistor 224, and a second inverter includes PMOS load transistor 223 and NMOS drive transistor 225. The first inverter is cross-coupled to the second inverter to strengthen the values stored on each side of memory cell 220. Node Q retains the stored value of memory cell 220, while node $\overline{Q}$ retains the complement of the stored value of memory cell 220. Transistors 226, 227 provide access to bitline pairs 242 based on wordline 232.

The voltage, $V_{CELL}$, is applied to the cross-coupled inverters to power memory cell 220. When wordline 232 is not selected (e.g., logic low signal), memory cell 220 is in standby mode and can hold the stored value as long as the voltage, $V_{CELL}$, is applied. When wordline 232 is selected (e.g., logic high signal), transistors 226, 227 couple nodes Q and $\overline{Q}$ to BL and $\overline{BL}$, respectively, and memory cell 220 transitions to active mode in which the stored value may be read or a new value may be written using bitline pair 242.

During a read cycle, BL holds the same value that is stored in memory cell 220, while $\overline{BL}$ holds the inverse of the value that is stored in memory cell 220. During a write cycle, write circuitry (not depicted for clarity) is coupled to bitline pair 242. Rather than writing a logic 0 or a logic 1 to node Q, a logic 0 is written to node Q or node $\overline{Q}$ depending on which logic value (i.e., 0 or 1) should be stored in memory cell 220. To write a value to memory cell 220, one bitline is held at $V_{DD}$ while the other is held at $V_{SS}$. Holding the bitline at $V_{SS}$ will cause the respective inverter to be pulled past the trip point, which will cause memory cell 220 to latch and hold the new value.

Sense amplifier 254 includes 2 PMOS transistors, i.e., transistors 251 ($P_1$), 253 ($P_2$), and 3 NMOS transistors, i.e., transistors 255 ($N_1$), 257 ($N_2$), and 259 ($N_3$).

More particularly, transistors 251, 253 form a differential pair with an active current mirror load provided by transistors 255, 257 and a biasing current source provided by transistor 259. The bitline pair is connected to the gates of the differential pair transistors and the output Q is tapped from the $\overline{BL}$ side. The source terminals of transistors 251, 253 are coupled to the voltage line $V_{DD}$, the drain terminals are coupled to the source terminals of transistors 255, 257, respectively, and the gate terminals are coupled to the source terminal of transistor 255. The gate terminal of transistor 255 is coupled to BL of bitline pair 242, the gate terminal of transistor 257 is coupled to $\overline{BL}$ of bitline pair 242, and the gate terminal of transistor 259 is coupled to the SAE control signal line. The drain terminals of transistors 255, 257 are coupled to the source terminal of transistor 259, while the drain terminal of transistor 259 is coupled to the voltage line $V_{SS}$. Transistors 251, 253 are identically sized, and transistors 255, 257 are also identically sized.

Generally, sense amplifier 254 senses the voltage difference between BL and $\overline{BL}$, amplifies and then outputs the voltage difference to indicate whether memory cell 220 is storing a logic 0 or a logic 1. BL and $\overline{BL}$ are precharged before each read cycle to ensure that the difference between BL and $\overline{BL}$ is caused by the value that is stored at node Q in memory cell 220, and output buffer 258 ensures that the full logic level is presented to I/O bus 260.

The sense cycle begins when the SEA control signal is set to a logic high signal, which causes a constant biasing current, $I_{SS}$, to flow through transistor 259. When BL and $\overline{BL}$ voltages are exactly equal (i.e., right after precharging), a current equal to $0.5 \cdot I_{SS}$ will flow through both sides of sense amplifier 254. After memory cell 220 is enabled, one bitline will begin to discharge (e.g., BL) based on the value stored in memory cell 220, and, as this bitline discharges, the voltage supplied to the gate of the transistor on that side of sense amplifier 254 (e.g., transistor 255) will decrease, causing the drain current to decrease as the transistor begins to turn off. Because the current source is supplying a total current to sense amplifier 254 that is equal to $I_{SS}$, the decrease in drain current on one side of sense amplifier 254 will cause the current in the opposite side of sense amplifier 254 to increase. As the transistor continues to turn off, the output voltage will rise to equal the supply voltage, $V_{DD}$. A relatively small difference between BL and $\overline{BL}$ will produce a large difference in output voltages.

While sense amplifier 254 has a differential non-latch architecture, various latch architectures are also supported, such as, for example, a differential latch architecture, a latch architecture with pass transistors, a current-controlled latch architecture, etc.

To initiate a burst read with flexible burst length, a burst read request is received by control circuitry 270. The burst read request includes the RDEN, BSTEN, ADDR and BSTA signals. In many embodiments, these signals are provided as electrical signals to specific hardware pins on memory 200, while in other embodiments, one or more of these signals may be provided in digital form and then decoded.

In many embodiments, the burst address BSTA includes one bit for each word stored in each row, e.g., BSTA[C-1:0]. In the embodiments discussed above, each group includes 4 columns which stores 4 words in each row, so C equals 4 and the burst address BSTA includes 4 bits, e.g., BSTA[3:0]. Each bit indicates whether the corresponding word on the wordline decoded from the memory address is to be read during the burst read. Advantageously, any combination of words may be read during a burst read cycle, such as, for example, the first three words stored in columns 1, 2 and 3 of the groups (skipping the fourth word), the first, third and fourth words stored in columns 1, 3 and 4 of the groups (skipping the second word), the second and third words stored in columns 2 and 3 of the groups (skipping the first and fourth words), etc. Table 1 presents an embodiment of the burst address BSTA[3:0].

TABLE 1

| BSTA[3:0] | Word 1 | Word 2 | Word 3 | Word 4 |
|---|---|---|---|---|
| 1111 | read | read | read | read |
| 1110 | skip | read | read | read |
| 1101 | read | skip | read | read |
| 1011 | read | read | skip | read |
| 0111 | read | read | read | skip |
| 1100 | skip | skip | read | read |
| 1010 | skip | read | skip | read |
| 1001 | read | skip | skip | read |
| 0110 | skip | read | read | skip |
| 0101 | skip | read | skip | skip |
| 0011 | read | read | skip | skip |

TABLE 1-continued

| BSTA[3:0] | Word 1 | Word 2 | Word 3 | Word 4 |
|---|---|---|---|---|
| 1000 | skip | skip | skip | read |
| 0100 | skip | skip | read | skip |
| 0010 | skip | read | skip | skip |
| 0001 | read | skip | skip | skip |

The burst read operation includes a setup cycle followed by 1 to C read cycles. When a word is "skipped," the read cycle corresponding to that word is "skipped" (i.e., not performed), and the word is not output from burst circuitry 250 to I/O bus 260. Instead, the read cycle corresponding to the next word to be read is performed, and so on until no more words are to be read during that burst read operation.

Figure 5A:
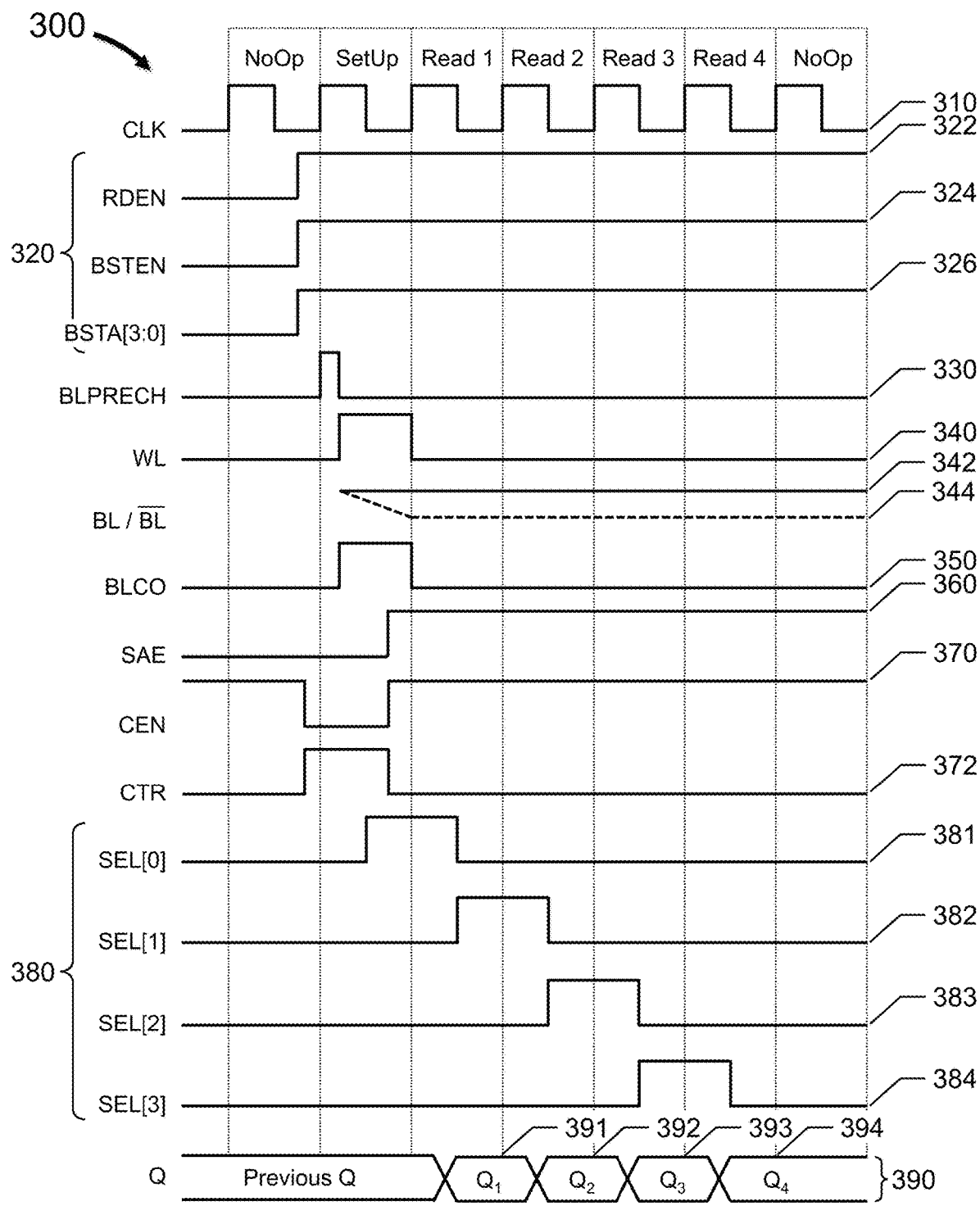
FIGS. 5A and 5B depict timing diagrams of the operation of a memory during a burst read operation, in accordance with embodiments of the present disclosure.

FIG. 5A depicts a timing diagram 300 of the operation of memory 200 during a burst read operation, in accordance with an embodiment of the present disclosure.

Timing diagram 300 depicts a clock (CLK) signal 310 and several operation cycles, including an initial "no operation" (NoOp) cycle, a burst read setup cycle, burst read cycles 1, 2, 3 and 4, and another NoOp cycle. CLK signal 310 is generated by a component of SoC 100, and provided as an input to memory 200.

Burst read request signals 320 include RDEN signal 322, BSTEN signal 324, BSTA signal 326, and the ADDR signal (not depicted for clarity). Generally, control circuitry 270 generates bitline precharge (BLPRECH) control signal 330, bitline cut-off (BLCO) control signal 350, and sense amplifier enable (SAE) control signal 360, and, in cooperation with address decoder 230, generates wordline (WL) signal 340. Control circuitry 270 also generates and provides CEN control signal 370 to FSM 400, which generates SEL control signals 380 based on CLK signal 310, CEN control signal 370 and BSTA signal 326. SEL control signals 380 includes SEL[0] control signal 381, SEL[1] control signal 382, SEL[2] control signal 383 and SEL[3] control signal 384. Other signals are also depicted, including BL signal 342, BL signal 344, CTR signal 372, and output data (Q) signals 390 including $Q_1$ signal 391, $Q_2$ signal 392, $Q_3$ signal 393 and $Q_4$ signal 394.

Burst read request signals 320 are depicted as arriving at control circuitry 270 during the latter portion of the initial NoOp cycle, which initiates or triggers the burst read operation. Control circuitry 270 drives CEN control signal 370 to a logic low level and provides this signal to FSM 400, which generates SEL control signals 380 based on CLK signal 310, CEN control signal 370 and BSTA signal 326, as discussed below.

The burst setup cycle is triggered by the next rising transition of CLK signal 310 following the arrival of burst read request signals 320 at control circuitry 270. During the burst setup cycle, BLPRECH signal 330 transitions from an inactive state (i.e., logic low level) to an active state (e.g., a logic high level) for a predetermined portion of the burst setup cycle, and then transitions back to the inactive state. During the active state, bitline precharge circuitry 240 begins to charge the bitline pairs 242 to a logical value of "1", while during the inactive state, bitline pre-charge circuitry 240 does not pre-charge the bitline pairs 242.

After the BLPRECH signal 330 transitions to the inactive state, control circuitry 270 provides the ADDR signal to address decoder 230, which decodes the address and transitions the appropriate wordline 232 to an active state (e.g., logic high level), represented by WL signal 340, which generates the differentials on bitline pairs 242, represented by BL signal 342 and $\overline{BL}$ signal 344. At the end of the burst setup cycle, WL signal 340 transitions to an inactive state (e.g., logic low level). Similarly, after the BLPRECH signal 330 transition to the inactive state, BLCO control signal transitions from an active state (e.g., logic low level) to an inactive state (e.g., logic high level) until the end of the burst setup cycle. During the active state, bitline cut-off circuitry 252 "cuts-off" or decouples each bitline pair 242 from the respective sense amplifier 254. During the inactive state, bitline cut-off circuitry 252 couples each bitline pair 242 to the respective sense amplifier 254.

Just before the end of the burst setup cycle, SAE control signal 360 transitions from the inactive state (e.g., logic low level) to the active state (e.g., logic high level). In response, sense amplifiers 254 sense the values stored in the memory cells 220 of the active wordline 232. In many embodiments, SAE control signal 360 remains in the active state during the next 4 burst read cycles. At the end of the burst setup cycle, the transition of WL signal 340 to the inactive state ends the bitline pre-charge, and, since the inactive state isolates bitline pairs 242 from memory cells 220, the output of sense amplifiers 254 is latched.

In this example, BSTA[3:0] is equal to [1 1 1 1], so all four words from the memory address identified by the ADDR signal are read from memory cell 220. FSM 400 generates SEL control signals 380 based on CLK signal 310, CEN control signal 370, and BSTA signal 326. The following description refers to burst circuitry $250_1$ depicted in FIG. 3.

After CLK signal 310 falls in the burst setup cycle, SEL[0] control signal 381 transitions from an inactive state (e.g., logic low level) to an active state (e.g., logic high level), while SEL[1] control signal 382, SEL[2] control signal 383, and SEL[3] control signal 384 remain in the inactive state. In response, column selector $256_1$ selects and provides the output of sense amplifier $254_1^1$ (i.e., $Q_1$) to output buffer $258_1$.

After CLK signal 310 falls in burst read cycle 1, SEL[0] control signal 381 transitions to the inactive state, SEL[1] control signal 382 transitions to the active state, and SEL[2] control signal 383 and SEL[3] control signal 384 remain in the inactive state. In response, output buffer $258_1$ places $Q_1$ onto I/O bus 260, and then column selector $256_1$ selects and provides the output of sense amplifier $254_1^2$ (i.e., $Q_2$) to output buffer $258_1$.

After CLK signal 310 falls in burst read cycle 2, SEL[1] control signal 382 transitions to the inactive state, SEL[2] control signal 383 transitions to the active state, and SEL[0] control signal 381 and SEL[3] control signal 384 remain in the inactive state. In response, output buffer $258_1$ places $Q_2$ onto I/O bus 260, and then column selector $256_1$ selects and provides the output of sense amplifier $254_1^3$ (i.e., $Q_3$) to output buffer $258_1$.

After CLK signal 310 falls in burst read cycle 3, SEL[2] control signal 383 transitions to the inactive state, SEL[3] control signal 384 transitions to the active state, and SEL[0] control signal 381 and SEL[1] control signal 382 remain in the inactive state. In response, output buffer 258 places $Q_3$ onto I/O bus 260, and then column selector $256_1$ selects and provides the output of sense amplifier $254_1^4$ (i.e., $Q_4$) to output buffer $258_1$.

After CLK signal 310 falls in burst read cycle 4, SEL[2] control signal 383 transitions to the inactive state, and SEL[0] control signal 381, SEL[1] control signal 382, and SEL[2] control signal 383 remain in the inactive state. In response, output buffer $258_1$ places $Q_4$ onto I/O bus 260.

Figure 5B:
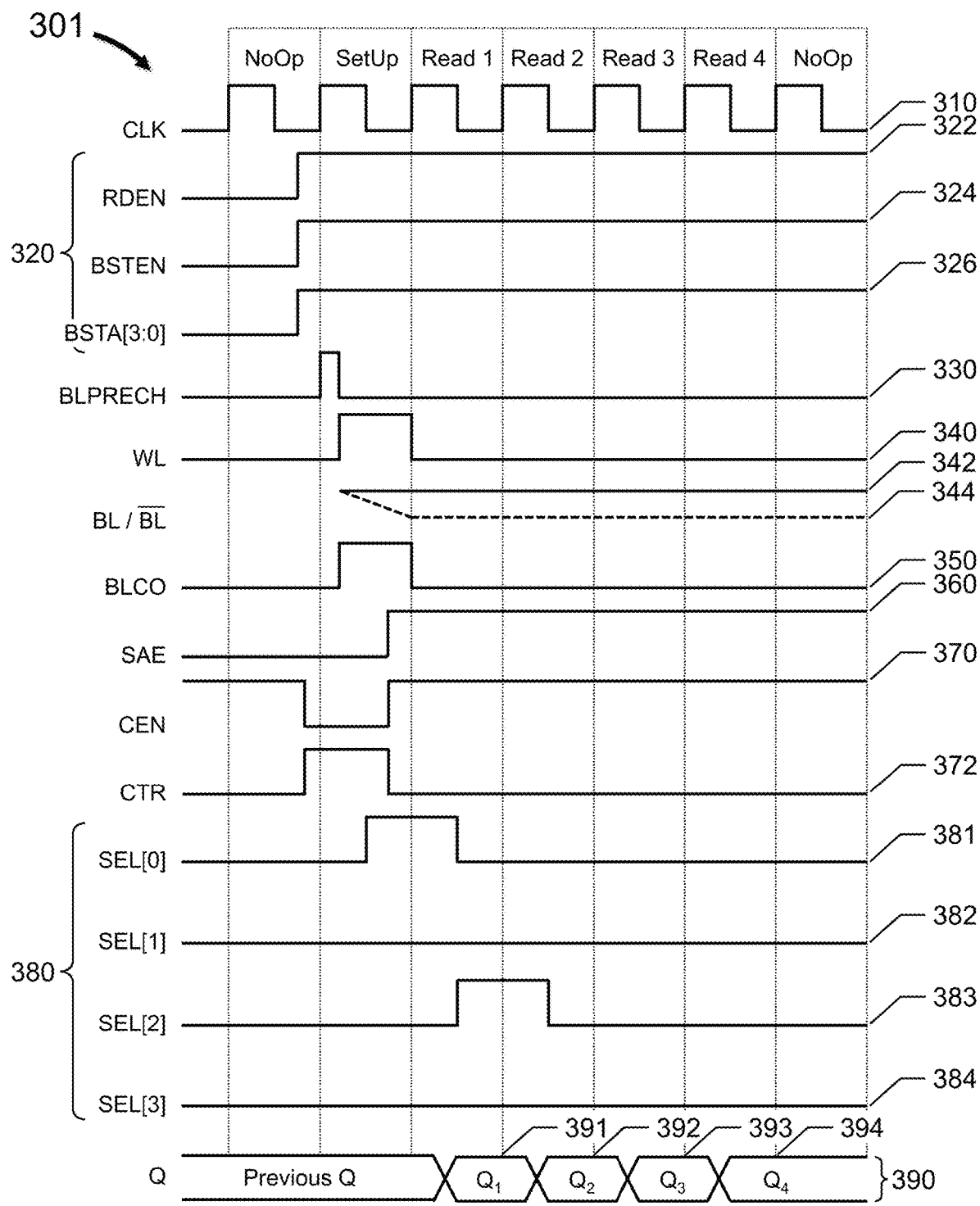

FIG. 5B depicts a timing diagram 301 of the operation of memory 200 during a burst read operation, in accordance with an embodiment of the present disclosure.

In this example, BSTA[3:0] is equal to [0 1 0 1], so two of the four words from the memory address identified by the ADDR signal are read from memory cell 220. FSM 400 generates SEL control signals 380 based on CLK signal 310, CEN control signal 370, and BSTA signal 326.

After CLK signal 310 falls in the burst setup cycle, SEL[0] control signal 381 transitions from an inactive state (e.g., logic low level) to an active state (e.g., logic high level), while SEL[1] control signal 382, SEL[2] control signal 383, and SEL[3] control signal 384 remain in the inactive state. In response, column selector $256_1$ selects and provides the output of sense amplifier $254_1{}^1$ (i.e., $Q_1$) to output buffer $258_1$.

After CLK signal 310 falls in burst read cycle 1, SEL[0] control signal 381 transitions to the inactive state, SEL[2] control signal 383 transitions to the active state, and SEL[1] control signal 382 and SEL[3] control signal 384 remain in the inactive state. In response, output buffer $258_1$ places $Q_1$ onto I/O bus 260, and then column selector $256_1$ selects and provides the output of sense amplifier $254_1{}^3$ (i.e., $Q_3$) to output buffer $258_1$.

After CLK signal 310 falls in burst read cycle 2, SEL[2] control signal 383 transitions to the inactive state, and SEL[0] control signal 381, SEL[1] control signal 382 and SEL[3] control signal 384 remain in the inactive state. In response, output buffer $258_1$ places $Q_3$ onto I/O bus 260.

After CLK signal 310 falls in burst read cycle 3, SEL[0] control signal 381, SEL[1] control signal 382, SEL[2] control signal 383 and SEL[3] control signal 384 remain in the inactive state. In response, no data is provided onto I/O bus 260.

After CLK signal 310 falls in burst read cycle 4, SEL[0] control signal 381, SEL[1] control signal 382, SEL[2] control signal 383 and SEL[3] control signal 384 remain in the inactive state. In response, no data is provided onto I/O bus 260.

Figure 6:
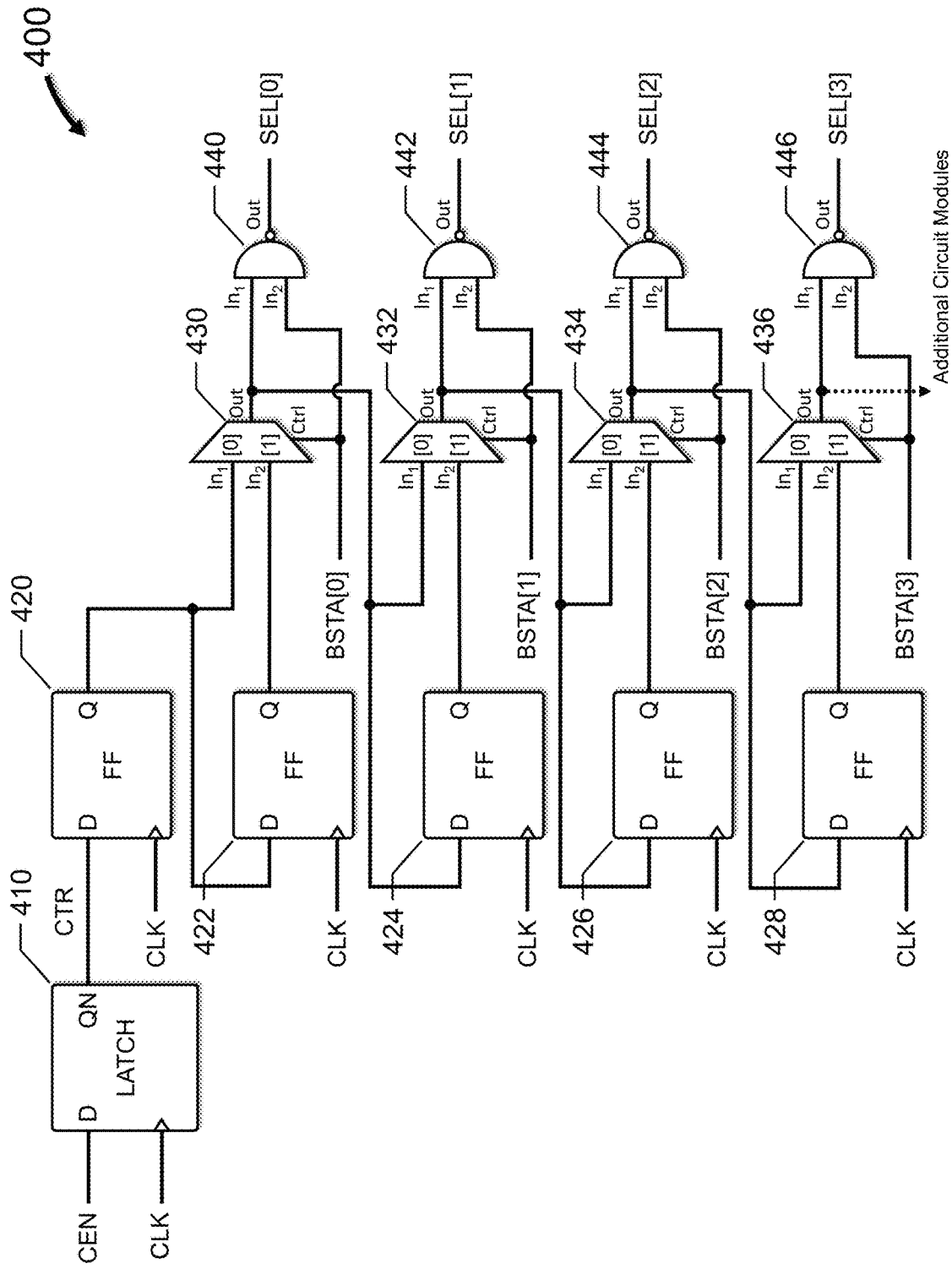
FIG. 6 depicts a block diagram of a finite state machine, in accordance with an embodiment of the present disclosure.

FIG. 6 depicts a block diagram of finite state machine 400, in accordance with an embodiment of the present disclosure.

FSM 400 includes latch 410, flip flops (FF) 420, 422, 424, 426 and 428, multiplexers 430, 432, 434 and 436, and NAND gates 440, 442, 444 and 446. Latch 410 includes a data input (i.e., D), to receive CEN control signal 370, and a clock input (i.e., triangle) to receive CLK signal 310, and an inverted output (i.e., QN). Each FF 420, 422, 424, 426 and 428 includes a data input (i.e., D), a clock input (i.e., triangle) to receive CLK signal 310, and an output (i.e., Q). Each multiplexer 430, 432, 434 and 436 includes a first input, a second input, a control input and an output. Each NAND gate 440, 442, 444 and 446 includes a first input, a second input and an output. Due to the modularity of each BSTA processing circuit, additional BSTA[i] signals may be accommodated by simply adding additional BSTA circuit modules.

When CEN control signal 370 transitions from a logic high level to a logic low level during the burst read setup cycle, the rising edge of the SetUp cycle initiates the generation of SEL control signals 380. As discussed above, when burst read request signals 320 arrive at control circuitry 270 during the latter portion of the initial NoOp cycle, the burst read operation is initiated, and control circuitry 270 drives CEN control signal 370 to a logic low level and provides this signal to FSM 400, and, more particularly, to the data input of latch 410.

The inverted output QN of latch 410 outputs CTR signal 272, having a logic high level, to the data input of FF 420. The functioning of the remaining portion of FSM 400 is driven by the transition of the CEN control signal 370 back to logic high level and the transition of the CTR control signal 372 back to logic low level (at the end of the SetUp cycle), the transitions of CLK signal 310 during each burst read clock cycle, and BSTA signal 326 (i.e., the bit values of BSTA[3:0]).

Generation of SEL[0] Control Signal

The output of FF 420 is provided to the data input (D) of FF 422 and the first input ($In_1$) of multiplexer 430. The output (Q) of FF 422 is provided to the second input ($In_2$) of multiplexer 430. The first bit, i.e., BSTA[0], of BSTA signal 326 is provided to the control input (Ctrl) of multiplexer 430 and the second input ($In_2$) of NAND gate 440. The output of multiplexer 430 is provided to the first input ($In_1$) of NAND gate 440. The output of NAND gate 440 is SEL[0] control signal 381.

When BSTA[0] is set to 1, multiplexer 430 selects the second input ($In_2$), and the output of NAND gate 440 is 1, which is the SEL[0] control signal 381. The remaining control signals 382, 383 and 384 are set to 0 because only one control signal is active during a read cycle, regardless of the values of BSTA[1], BSTA[2] and BSTA[3], which are processed during subsequent read cycles.

When BSTA[0] is set to 1, SEL[0] control signal 381 is set to 1 during the first read cycle, and is set to 0 during the second, third and fourth read cycles.

When BSTA[0] is set to 0, multiplexer 430 selects the first input ($In_1$) and the output of NAND gate 440 is 0, which is the SEL[0] control signal 381. The control signals 382, 383 and 384 may be 0 or 1, depending on the values of BSTA[1], BSTA[2] and BSTA[3], respectively, which are processed sequentially during the current (first) read cycle until an active bit is encountered and an active control signal is generated.

Generation of SEL[1] Control Signal

The output of multiplexer 430 is provided to the data input (D) of FF 424 and the first input ($In_1$) of multiplexer 432. The output (Q) of FF 424 is provided to the second input ($In_2$) of multiplexer 432. The second bit, i.e., BSTA[1], of BSTA signal 326 is provided to the control input (Ctrl) of multiplexer 432 and the second input ($In_2$) of NAND gate 442. The output of multiplexer 432 is provided to the first input ($In_1$) of NAND gate 442. The output of NAND gate 442 is SEL[1] control signal 382.

When BSTA[0] is set to 0 and BSTA[1] is set to 1, multiplexer 432 selects the second input ($In_2$) and the output of NAND gate 442 is 1, which is the SEL[1] control signal 382. Control signal 381 is already set to 0, and the remaining control signals 383 and 384 are set to 0 because only one control signal is active during a read cycle, regardless of the values of BSTA[2] and BSTA[3], which are processed during subsequent read cycles.

When BSTA[0] is set to 0 and BSTA[1] is set to 1, control signal 382 is set to 1 during the first read cycle. When BSTA[0] and BSTA[1] are both set to 1, control signal 381 is set to 1 during the first read cycle and control signal 382 is set to 1 during the second read cycle.

When BSTA[0] and BSTA[1] are set to 0, multiplexer 432 selects the first input ($In_1$) and the output of NAND gate 442 is 0, which is the SEL[1] control signal 382. The control signals 383 and 384 may be 0 or 1, depending on the values of BSTA[2] and BSTA[3], respectively, which are processed sequentially during the current (first) read cycle until an active bit is encountered and an active control signal is generated.

Generation of SEL[2] Control Signal

The output of multiplexer 432 is provided to the data input (D) of FF 426 and the first input (In$_1$) of multiplexer 434. The output of FF 426 is provided to the second input (In$_2$) of multiplexer 434. The third bit, i.e., BSTA[2], of BSTA signal 326 is provided to the control input (Ctrl) of multiplexer 434 and the second input (In$_2$) of NAND gate 444. The output of multiplexer 434 is provided to the first input (In$_1$) of NAND gate 444. The output of NAND gate 444 is SEL[2] control signal 383.

When BSTA[0] and BSTA[1] are set to 0 and BSTA[2] is set to 1, multiplexer 434 selects the second input (In$_2$) and the output of NAND gate 444 is 1, which is the SEL[2] control signal 383. Control signals 381 and 382 are already set to 0, and the remaining control signal 384 is set to 0 because only one control signal is active during a read cycle, regardless of the value of BSTA[3], which is processed during a subsequent read cycle.

When BSTA[0] and BSTA[1] are set to 0 and BSTA[2] is set to 1, control signal 383 is set to 1 during the first read cycle. When BSTA[0] is set to 0 and BSTA[1] and BSTA[2] are set to 1, control signal 382 is set to 1 during the first read cycle, and control signal 383 is set to 1 during the second read cycle. When BSTA[1] is set to 0 and BSTA[0] and BSTA[2] are set to 1, control signal 381 is set to 1 during the first read cycle, and control signal 383 is set to 1 during the second read cycle.

When BSTA[0], BSTA[1] and BSTA[2] are set to 0, multiplexer 434 selects the first input (In$_1$) and the output of NAND gate 444 is 0, which is the SEL[2] control signal 383. The control signal 384 may be 0 or 1, depending on the value of BSTA[3], which is processed during the current (first) read cycle. If an active bit is encountered, then an active control signal is generated; otherwise, no active control signal is generated.

Generation of SEL[3] Control Signal

The output of multiplexer 434 is provided to the data input of FF 428 and the first input of multiplexer 436. The output of FF 428 is provided to the second input of multiplexer 436. The fourth bit, i.e., BSTA[3], of BSTA signal 326 is provided to the control input of multiplexer 436 and the second input of NAND gate 446. The output of multiplexer 436 is provided to the first input of NAND gate 446. The output of NAND gate 446 is SEL[3] control signal 384.

When BSTA[0], BSTA[1] and BSTA[2] are set to 0 and BSTA[3] is set to 1, multiplexer 436 selects the second input (In$_2$) and the output of NAND gate 446 is 1, which is the SEL[3] control signal 384. Control signals 381, 382 and 383 are already set to 0.

When BSTA[0], BSTA[1] and BSTA[2] are set to 0 and BSTA[3] is set to 1, control signal 384 is set to 1 during the first read cycle. When BSTA[0] and BSTA[1] are set to 0 and BSTA[2] and BSTA[3] are set to 1, control signal 383 is set to 1 during the first read cycle, and control signal 384 is set to 1 during the second read cycle. When BSTA[0] and BSTA[2] are set to 0 and BSTA[1] and BSTA[3] are set to 1, control signal 382 is set to 1 during the first read cycle, and control signal 384 is set to 1 during the second read cycle.

When BSTA[0] is set to 0 and BSTA[1], BSTA[2] and BSTA[3] are set to 1, control signal 382 is set to 1 during the first read cycle, control signal 383 is set to 1 during the second read cycle, and control signal 384 is set to 1 during the third read cycle. When BSTA[0], BSTA[1], BSTA[2] and BSTA[3] are set to 1, control signal 381 is set to 1 during the first read cycle, control signal 382 is set to 1 during the second read cycle, control signal 383 is set to 1 during the third read cycle, and control signal 384 is set to 1 during the fourth read cycle.

When BSTA[0], BSTA[1], BSTA[2] and BSTA[3] are set to 0, multiplexer 436 selects the first input (In$_1$) and the output of NAND gate 446 is 0, which is the SEL[3] control signal 384. The control signals 381, 382 and 383 are also 0.

As depicted in FIG. 5A, when BSTA[3:0] is equal to [1 1 1 1], all four words are read during the four sequential clock cycles, and, as depicted in FIG. 5B, when BSTA[3:0] is equal to [0 1 0 1], the first and third words are read during the first two sequential clock cycles, and no word is read on the third and fourth clock cycles. In this manner, FSM 400 processes the active bits BSTA[3:0] in sequential clock cycles, thereby avoiding a no-op condition when a particular bit is set to 0.

Advantageously, bitline cut-off circuitry 252 and the sense amplifier enable logic have BSTA information to limit signal toggling as per the BSTA. The single toggle of WL signal 340 during the setup cycle minimizes bitline pair 242 swing development time for lower dynamic power, and eliminates the need for large wordline circuit area. In response to the fall of BLCO signal 350 at the end of the setup cycle, bitline cut-off circuitry 252 advantageously "cuts-off" all four bitline pairs 242 in each group from sense amplifiers 254. And, control circuitry 270 ensures that BLCO signal 350 and SAE signal 360 are in tune with the BSTA, which avoids signal toggling for maximum dynamic power savings.

The embodiments described herein are combinable.

In one embodiment, a memory includes an array of random access memory storage elements, including selectable rows and groups of selectable columns, configured to output a selected number of words in response to a row select signal and a sequence of column select signals; and circuitry configured to receive a burst read request including a memory address and a burst address indicating the selected number of words, generate the row select signal based on the memory address, generate the sequence of column select signals based on the burst address, and provide the row select signal and the sequence of column select signals to the array.

In another embodiment of the memory, the sequence of column select signals is provided to each group of selectable columns, and each word of the selected number of words is formed from one bit output from each group of selectable columns; each group includes a same number of selectable columns, and a total number of selectable words is the same as the number of selectable columns in each group; and the selected number of words is less than the total number of selectable words.

In another embodiment of the memory, the selectable columns in each group are arranged in a first sequence, and the selected number of words are formed from a second sequence of selectable columns in each group that is different from the first sequence.

In another embodiment of the memory, the sequence of column select signals defines the second sequence of selectable columns in each group.

In another embodiment of the memory, the burst address includes a value that indicates the selection or non-selection of each word, and said generate the sequence of column select signals is based on the value.

In another embodiment of the memory, the burst address includes a sequence of bits, each bit indicates the selection or non-selection of a word, and said generate the sequence of column select signals is based on the sequence of bits.

In another embodiment of the memory, each group includes a same number of selectable columns, each selectable column including a pair of bitlines, a bitline precharge circuit coupled to the pair of bitlines, a number of random access memory storage units coupled to the pair of bitlines, each random access memory storage unit coupled to a different wordline, and a sense amplifier coupled to the pair of bitlines; and a selector, coupled to the sense amplifier of each selectable column, configured to output a sequence of bit values from the number of selectable columns in response to the sequence of column select signals.

In another embodiment of the memory, the random access memory storage units in each selectable column are coupled to the pair of bitlines between the bitline precharge circuit and the sense amplifier; and each selectable column includes a bitline cutoff circuit coupled to the pair of bitlines between a last random access memory storage unit and the sense amplifier.

In another embodiment of the memory, the selected number of words are output over sequential clock cycles.

In one embodiment, a system cache includes a plurality of memories as described above.

In one embodiment, a method for reading a memory includes receiving a burst read request including a memory address and a burst address indicating a selected number of words to be read from an array of random access memory storage elements that includes selectable rows and groups of selectable columns; generating a row select signal based on the memory address; generating a sequence of column select signals based on the burst address; and outputting, from the array, the selected number of words in response to receiving the row select signal and the sequence of column select signals.

In another embodiment, the method further includes providing the sequence of column select signals to each group of selectable columns; forming each word of the selected number of words from one bit output from each group of selectable columns; and each group includes a same number of selectable columns, and a total number of selectable words is the same as the number of selectable columns in each group.

In another embodiment of the method, the selected number of words is less than the total number of selectable words.

In another embodiment of the method, the selectable columns in each group are arranged in a first sequence, and the method further includes forming the selected number of words from a second sequence of selectable columns in each group that is different from the first sequence.

In another embodiment of the method, the sequence of column select signals defines the second sequence of selectable columns in each group.

In another embodiment of the method, the burst address includes a value that indicates the selection or non-selection of each word, and said generating the sequence of column select signals is based on the value.

In another embodiment of the method, the burst address includes a sequence of bits, each bit indicates the selection or non-selection of a word, and said generating the sequence of column select signals is based on the sequence of bits.

In another embodiment of the method, each group includes a same number of selectable columns, each selectable column including a pair of bitlines, a bitline precharge circuit coupled to the pair of bitlines, a number of random access memory storage units coupled to the pair of bitlines, each random access memory storage unit coupled to a different wordline, and a sense amplifier coupled to the pair of bitlines; and a selector, coupled to the sense amplifier of each selectable column, configured to output a sequence of bit values from the number of selectable columns in response to receiving the sequence of column select signals.

In another embodiment of the method, the random access memory storage units in each selectable column are coupled to the pair of bitlines between the bitline precharge circuit and the sense amplifier; and each selectable column includes a bitline cutoff circuit coupled to the pair of bitlines between a last random access memory storage unit and the sense amplifier.

In another embodiment of the method, said outputting the selected number of words includes outputting the selected number of words over sequential clock cycles.

While implementations of the disclosure are susceptible to embodiment in many different forms, there is shown in the drawings and will herein be described in detail specific embodiments, with the understanding that the present disclosure is to be considered as an example of the principles of the disclosure and not intended to limit the disclosure to the specific embodiments shown and described. In the description above, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," "for example," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus, device, system, etc. may be used interchangeably in this text.

The many features and advantages of the disclosure are apparent from the detailed specification, and, thus, it is intended by the appended claims to cover all such features and advantages of the disclosure which fall within the scope of the disclosure. Further, since numerous modifications and variations will readily occur to those skilled in the art, it is not desired to limit the disclosure to the exact construction and operation illustrated and described, and, accordingly, all suitable modifications and equivalents may be resorted to that fall within the scope of the disclosure.

What is claimed is:

1. A memory, comprising:
   an array of random access memory storage elements, including selectable rows and groups of selectable columns, configured to output a selected number of words in response to a row select signal and a sequence of column select signals; and
   circuitry configured to:
      receive a burst read request including a memory address and a burst address indicating the selected number of words,
      generate the row select signal based on the memory address,
      generate the sequence of column select signals based on the burst address, and
      provide the row select signal and the sequence of column select signals to the array,
   where:
      the sequence of column select signals is provided to each group of selectable columns, and each word of the selected number of words is formed from one bit output from each group of selectable columns,
      each group includes a same number of selectable columns, and a total number of selectable words is the same as the number of selectable columns in each group, and
      the selected number of words is less than the total number of selectable words.

2. The memory according to claim 1, where the selectable columns in each group are arranged in a first sequence, and the selected number of words are formed from a second sequence of selectable columns in each group that is different from the first sequence.

3. The memory according to claim 2, where the sequence of column select signals defines the second sequence of selectable columns in each group.

4. The memory according to claim 3, where the burst address includes a value that indicates the selection or non-selection of each word, and said generate the sequence of column select signals is based on the value.

5. The memory according to claim 4, where the burst address includes a sequence of bits, each bit indicates the selection or non-selection of a word, and said generate the sequence of column select signals is based on the sequence of bits.

6. The memory according to claim 1, where each group includes:
   a same number of selectable columns, each selectable column including:
      a pair of bitlines,
      a bitline precharge circuit coupled to the pair of bitlines,
      a number of random access memory storage units coupled to the pair of bitlines, each random access memory storage unit coupled to a different wordline, and
      a sense amplifier coupled to the pair of bitlines; and
   a selector, coupled to the sense amplifier of each selectable column, configured to output a sequence of bit values from the number of selectable columns in response to the sequence of column select signals.

7. The memory according to claim 6, where:
   the random access memory storage units in each selectable column are coupled to the pair of bitlines between the bitline precharge circuit and the sense amplifier; and
   each selectable column includes a bitline cutoff circuit coupled to the pair of bitlines between a last random access memory storage unit and the sense amplifier.

8. The memory according to claim 1, where the selected number of words are output over sequential clock cycles.

9. A system cache comprising a plurality of memories, each memory according to claim 1.

10. A method for reading a memory, comprising:
    receiving a burst read request including a memory address and a burst address indicating a selected number of words to be read from an array of random access memory storage elements that includes selectable rows and groups of selectable columns;
    generating a row select signal based on the memory address;
    generating a sequence of column select signals based on the burst address;
    outputting, from the array, the selected number of words in response to receiving the row select signal and the sequence of column select signals, providing the sequence of column select signals to each group of selectable columns;

forming each word of the selected number of words from one bit output from each group of selectable columns; and each group includes a same number of selectable columns, and a total number of selectable words is the same as the number of selectable columns in each group.

11. The method according to claim 10, where the selected number of words is less than the total number of selectable words.

12. The method according to claim 11, where the selectable columns in each group are arranged in a first sequence, and the method further comprises:

forming the selected number of words from a second sequence of selectable columns in each group that is different from the first sequence.

13. The method according to claim 12, where the sequence of column select signals defines the second sequence of selectable columns in each group.

14. The method according to claim 13, where the burst address includes a value that indicates the selection or non-selection of each word, and said generating the sequence of column select signals is based on the value.

15. The method according to claim 13, where the burst address includes a sequence of bits, each bit indicates the selection or non-selection of a word, and said generating the sequence of column select signals is based on the sequence of bits.

16. The method according to claim 10, where each group includes:

a same number of selectable columns, each selectable column including:
a pair of bitlines,
a bitline precharge circuit coupled to the pair of bitlines,
a number of random access memory storage units coupled to the pair of bitlines, each random access memory storage unit coupled to a different wordline, and
a sense amplifier coupled to the pair of bitlines; and a selector, coupled to the sense amplifier of each selectable column, configured to output a sequence of bit values from the number of selectable columns in response to receiving the sequence of column select signals.

17. The method according to claim 16, where:

the random access memory storage units in each selectable column are coupled to the pair of bitlines between the bitline precharge circuit and the sense amplifier; and each selectable column includes a bitline cutoff circuit coupled to the pair of bitlines between a last random access memory storage unit and the sense amplifier.

18. The method according to claim 10, where said outputting the selected number of words includes outputting the selected number of words over sequential clock cycles.

\* \* \* \* \*